US010325787B2

(12) United States Patent
Hayashi et al.

(10) Patent No.: US 10,325,787 B2
(45) Date of Patent: Jun. 18, 2019

(54) SUBSTRATE PROCESSING APPARATUS AND SUBSTRATE PROCESSING METHOD

(71) Applicant: SHIBAURA MECHATRONICS CORPORATION, Yokohama-shi (JP)

(72) Inventors: Konosuke Hayashi, Yokohama (JP); Takashi Ootagaki, Yokohama (JP); Yuji Nagashima, Yokohama (JP); Akinori Iso, Yokohama (JP)

(73) Assignee: SHIBAURA MECHATRONICS CORPORATION, Yokohama-shi (JP)

(*) Notice: Subject to any disclaimer, the term of this patent is extended or adjusted under 35 U.S.C. 154(b) by 762 days.

(21) Appl. No.: 14/781,077

(22) PCT Filed: Mar. 25, 2014

(86) PCT No.: PCT/JP2014/058241
§ 371 (c)(1),
(2) Date: Sep. 29, 2015

(87) PCT Pub. No.: WO2014/157180
PCT Pub. Date: Oct. 2, 2014

(65) Prior Publication Data
US 2016/0071746 A1     Mar. 10, 2016

(30) Foreign Application Priority Data

Mar. 29, 2013  (JP) ................................. 2013-073877
Mar. 24, 2014  (JP) ................................. 2014-060462

(51) Int. Cl.
*B05D 1/00* (2006.01)
*B08B 3/10* (2006.01)
(Continued)

(52) U.S. Cl.
CPC ........ *H01L 21/67051* (2013.01); *B05D 1/005* (2013.01); *B08B 3/10* (2013.01);
(Continued)

(58) Field of Classification Search
CPC .............. B05D 1/005; H01L 21/02057; H01L 21/02282; H01L 21/30604;
(Continued)

(56) References Cited

U.S. PATENT DOCUMENTS 6,025,012 A * 2/2000 Matsuda ................. B05C 11/08
118/52
2002/0176928 A1* 11/2002 Minami .............. H01L 21/6715
427/8
(Continued)

FOREIGN PATENT DOCUMENTS

CN         101727009 A    6/2010
JP         2000 153210    6/2000
(Continued)

OTHER PUBLICATIONS

International Search Report dated May 13, 2014 in PCT/JP14/058241 Filed Mar. 25, 2014.
(Continued)

*Primary Examiner* — Yewebdar T Tadesse
*Assistant Examiner* — Stephen A Kitt
(74) *Attorney, Agent, or Firm* — Oblon, McClelland, Maier & Neustadt, L.L.P.

(57) ABSTRACT

According to one embodiment, a substrate processing apparatus (1) includes: a support (4) configured to support a substrate (W) in a plane; a rotation mechanism (5) configured to rotate the support (4) about an axis that crosses a surface of the substrate (W) supported by the support (4) as a rotation axis; a plurality of nozzles (6a, 6b, 6c), which are aligned from the center toward the periphery of the substrate (W) supported by the support (4), configured to eject a treatment liquid to the surface of the substrate (W) on the support (4) being rotated by the rotation mechanism (5), and a controller (9) configured to control the nozzles to eject the treatment liquid at different ejection timings according to the thickness of a film of the treatment liquid formed on the surface of the substrate (W) on the support (4) being rotated by the rotation mechanism (5).

6 Claims, 5 Drawing Sheets

(51) Int. Cl.
*H01L 21/02* (2006.01)
*H01L 21/66* (2006.01)
*H01L 21/67* (2006.01)
*H01L 21/306* (2006.01)
*H01L 21/687* (2006.01)

(52) U.S. Cl.
CPC .. *H01L 21/02057* (2013.01); *H01L 21/30604* (2013.01); *H01L 21/6708* (2013.01); *H01L 21/6715* (2013.01); *H01L 21/67253* (2013.01); *H01L 21/68714* (2013.01); *H01L 22/12* (2013.01)

(58) Field of Classification Search
CPC ........... H01L 21/67051; H01L 21/6715; H01L 21/67253; H01L 21/68714
See application file for complete search history.

(56) References Cited

U.S. PATENT DOCUMENTS

| | | |
|---|---|---|
| 2003/0211756 A1 | 11/2003 | Ito et al. |
| 2005/0022732 A1 | 2/2005 | Ito et al. |
| 2005/0026456 A1 | 2/2005 | Ito et al. |
| 2006/0280865 A1 | 12/2006 | Tateishi |
| 2007/0199579 A1 | 8/2007 | Hayasaki et al. |
| 2008/0090001 A1 | 4/2008 | Ito et al. |
| 2009/0071940 A1 | 3/2009 | Miyagi et al. |
| 2010/0098869 A1 | 4/2010 | Kinoshita |
| 2011/0008545 A1 | 1/2011 | Ito et al. |
| 2013/0034966 A1* | 2/2013 | Yeh ................... H01L 21/31111 438/704 |
| 2013/0040062 A1 | 2/2013 | Kinoshita |

FOREIGN PATENT DOCUMENTS

| | | |
|---|---|---|
| JP | 2002 336761 | 11/2002 |
| JP | 2004 14646 | 1/2004 |
| JP | 2004 237157 | 8/2004 |
| JP | 2007 220956 | 8/2007 |
| JP | 2010 62259 | 3/2010 |
| JP | 2010 239013 | 10/2010 |
| KR | 2003-0065412 A | 8/2003 |
| KR | 10-2007-0082880 A | 8/2007 |
| KR | 10-2009-0028414 A | 3/2009 |
| KR | 10-2013-0016036 A | 2/2013 |

OTHER PUBLICATIONS

Extended Search Report dated Jul. 12, 2016 in European Patent Application No. 14774908.9.
Combined Office Action and Search Report dated Dec. 15, 2016 in Chinese Patent Application No. 201480019122.3 (with partial unedited computer generated English translation and English translation of categories of cited documents).
Office Action dated Aug. 26, 2016 in Korean Patent Application No. 10-2015-7024852 (with English language translation).

* cited by examiner

SUBSTRATE PROCESSING APPARATUS AND SUBSTRATE PROCESSING METHOD

TECHNICAL FIELD

Embodiments described herein relate generally to a substrate processing apparatus and a substrate processing method.

BACKGROUND ART

A substrate processing apparatus is used in the process of manufacturing semiconductors, liquid crystal panels, and the like to supply a treatment liquid (e.g., resist stripping liquid, cleaning liquid, etc.) to a surface of a substrate, such as a wafer or a liquid crystal substrate, to thereby treat the surface. Among such substrate processing apparatuses are those that rotate a substrate horizontally and supply a treatment liquid to a surface of the substrate from a nozzle facing the center of the surface so that the treatment liquid is spread over the surface by the centrifugal force of the rotation. There has been proposed a substrate processing apparatus that performs such spinning operation (e.g., see Patent Document 1).

PRIOR ART DOCUMENT

Patent Document

[Patent Document 1] Japanese Unexamined Patent Application Publication No. 2002-336761

SUMMARY OF THE INVENTION

Problems to be Solved by the Invention

In the above substrate processing apparatus, a new treatment liquid (fresh treatment liquid) is supplied to the vicinity of the center of a substrate. However, the treatment liquid supplied to the vicinity of the center of the substrate flows to the periphery of the substrate by centrifugal force, and accordingly, the periphery of the substrate is supplied with the treatment liquid in which reaction or pollution has progressed (old treatment liquid). As a result, a difference occurs in treatment between the center and the periphery of the substrate. To suppress the difference in treatment, the supply of the treatment liquid is continued until the end of treatment for the periphery of the substrate. This increases the processing time and also the consumption of treatment liquid.

An object of the present invention is to provide a substrate processing apparatus and a substrate processing method, which can realize a reduction in the processing time and the consumption of treatment liquid.

Means of Solving the Problems

According to one embodiment, a substrate processing apparatus includes: a support configured to support a substrate in a plane; a rotation mechanism configured to rotate the support about an axis that crosses a surface of the substrate supported by the support as a rotation axis; a plurality of nozzles, which are aligned from the center toward the periphery of the substrate supported by the support, configured to eject a treatment liquid to the surface of the substrate on the support being rotated by the rotation mechanism, and a controller configured to control the nozzles to eject the treatment liquid at different ejection timings according to the thickness of a film of the treatment liquid formed on the surface of the substrate on the support being rotated by the rotation mechanism.

According to another embodiment, a substrate processing method includes: rotating a substrate in a plane; and ejecting, from a plurality of nozzles aligned from the center toward the periphery of the substrate, a treatment liquid to a surface of the substrate being rotated at different ejection timings according to the thickness of a film of the treatment liquid formed on the surface of the substrate being rotated.

Effects of the Invention

According to the present invention, it is possible to realize a reduction in the processing time and the consumption of treatment liquid.

MODES FOR CARRYING OUT THE INVENTION (First Embodiment)

A first embodiment will be described with reference to FIGS. 1 to 3.

Figure 1:
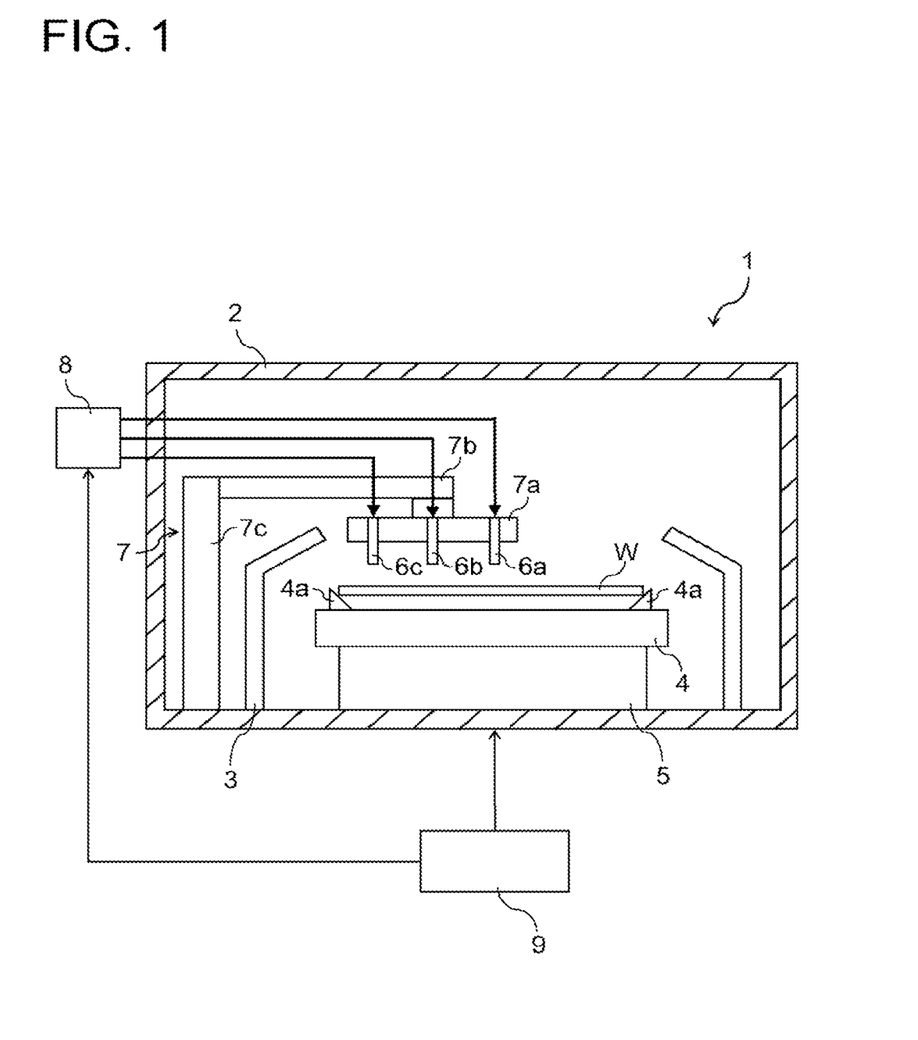
FIG. 1 is a diagram illustrating a schematic structure of a substrate processing apparatus according to a first embodiment.

As illustrated in FIG. 1, a substrate processing apparatus 1 of the first embodiment includes a treatment box 2 as a treatment chamber, a cup 3 arranged in the treatment box 2, a support 4 configured to support a substrate W horizontally in the cup 3, and a rotation mechanism 5 configured to rotate the support 4 in a horizontal plane. The substrate processing apparatus 1 further includes a plurality of nozzles 6a, 6b and 6c each configured to supply a treatment liquid to a surface of the substrate W on the support 4, a rocking mechanism 7 configured to support the nozzles 6a, 6b and 6c and move them between treatment and standby positions, a liquid supply unit 8 configured to supply the treatment liquid to the nozzles 6a, 6b and 6c, and a controller 9 configured to control each unit.

The cup 3 is formed in a cylindrical shape, and surrounds the periphery of the support 4 to accommodate it therein. The cup 3 includes a peripheral wall having an upper portion inclined inwardly in the radial direction, and an opening to expose the substrate W on the support 4. The cup 3 is configured to receive a treatment liquid flowing down or scattered from the rotating substrate W. Incidentally, the treatment liquid received is discharged through a discharge pipe (not illustrated) arranged in the bottom of the cup 3.

The support 4 is located near the center in the cup 3 to be rotatable in the horizontal plane. The support 4 includes a plurality of support members 4a such as pins. The support 4 removably holds the substrate W such as a wafer or a liquid crystal substrate by the support members 4a.

The rotation mechanism 5 includes a rotation shaft connected to the support 4 and a motor as a driving source to rotate the rotation shaft (both not illustrated). The rotation mechanism 5 rotates the support 4 via the rotation shaft by driving the motor. The rotation mechanism 5 is electrically connected to the controller 9, and operates under the control of the controller 9.

The nozzles 6a, 6b and 6c are aligned along the surface of the substrate W on the support 4 from the center toward the periphery of the substrate W. The nozzles 6a, 6b and 6c are located above the surface of the substrate W on the support 4. The nozzles 6a, 6b and 6c are supplied with the treatment liquid from the liquid supply unit 8 and eject it toward the surface of the rotating substrate W on the support from above the substrate W to supply the surface with the treatment liquid. Although FIG. 1 illustrates three nozzles, this number of them is exemplary only and not limited in particular.

The nozzle 6a is arranged as a first nozzle in a position facing near the center of the surface of the substrate W on the support 4. The nozzle 6b is arranged as a second nozzle in a position facing near the center of the radius of the surface of the substrate W on the support 4. The nozzle 6c is arranged as a third nozzle in a position facing near the periphery of the surface of the substrate W on the support 4.

The nozzles 6a, 6b and 6c are arranged in a straight line extending radially along the surface of the substrate W on the support 4. However, the nozzles 6a, 6b and 6c need not necessarily be arranged in a straight line. For example, the nozzles 6a, 6b and 6c may be alternately arranged to straddle the line. It suffices that the nozzles 6a, 6b and 6c are arranged on the circumferences of three circles having different diameters on the surface of the substrate W.

Desirably, each of the nozzles 6a, 6b and 6c has an ejection opening with a diameter of 1 mm or more (the nozzles 6a, 6b and 6c may have their respective ejection openings with same or different diameters) and an ejection angle of 90 degrees or less with respect to the surface of the substrate W. Further, the distance between each of the nozzles 6a, 6b and 6c and the surface of the substrate W is desirably 3 mm or more.

When the back surface of the substrate W is also required to be treated, i.e., to apply the surface treatment to both sides of the substrate W, in addition to the nozzles 6a, 6b and 6c, for example, another nozzle may be provided in the support 4 to eject the treatment liquid toward the back surface of the substrate W on the support 4. In this case, the treatment liquid may be supplied to the center of the back surface of the rotating substrate W from this nozzle.

The rocking mechanism 7 includes a holding head 7a configured to hold the nozzles 6a, 6b and 6c, an arm 7b configured to support the nozzles 6a, 6b and 6c together with the holding head 7a to allow them to move along the surface of the substrate W on the support 4, and a strut 7c configured to rotatably support the arm 7b in a horizontal plane. The rocking mechanism 7 is electrically connected to the controller 9, and operates under the control of the controller 9.

The rocking mechanism 7 moves each of the nozzles 6a, 6b and 6c to, for example, treatment position and standby position. The treatment position faces the surface of the substrate W on the support 4. The nozzles 6a, 6b and 6c are retracted from the treatment position to the standby position. The standby position allows the substrate W to be placed on the support 4 or taken out therefrom.

The liquid supply unit 8 includes a tank for storing the treatment liquid, a pump as a driving source, and a regulating valve for regulating the supply amount (all not illustrated). The liquid supply unit 8 supplies each of the nozzles 6a, 6b and 6c with the treatment liquid by the drive of the pump. The liquid supply unit 8 is electrically connected to the controller 9, and operates under the control of the controller 9.

For example, ozone water, hydrofluoric acid (HF), ultrapure water (DIW), and the like can be used as the treatment liquid. Various other treatment liquids can be used according to the content of treatment.

The controller 9 includes a microcomputer that centrally controls each unit, and a storage that stores various programs and substrate processing information related to substrate processing. The controller 9 controls the rotation mechanism 5, the liquid supply unit 8, and the like based on the substrate processing information and the various programs to control the substrate processing. The substrate processing supplies a treatment liquid fed from the liquid supply unit 8 to the surface of the rotating substrate W on the support 4 by ejecting it through the nozzles 6a, 6b and 6c.

In the substrate processing, the controller 9 controls the nozzles 6a, 6b and 6c to eject the treatment liquid in this order from the center toward the periphery of the substrate W. More specifically, the controller 9 regulates the opening degree of each of regulating valves (all not illustrated) arranged in a pipe leading to the nozzle 6a, a pipe leading to the nozzle 6b, and a pipe leading to the nozzle 6c. Thus, the regulating valves are opened in the order from the center toward the periphery of the substrate W to let the nozzles 6a, 6b and 6c eject the treatment liquid.

Figure 2:
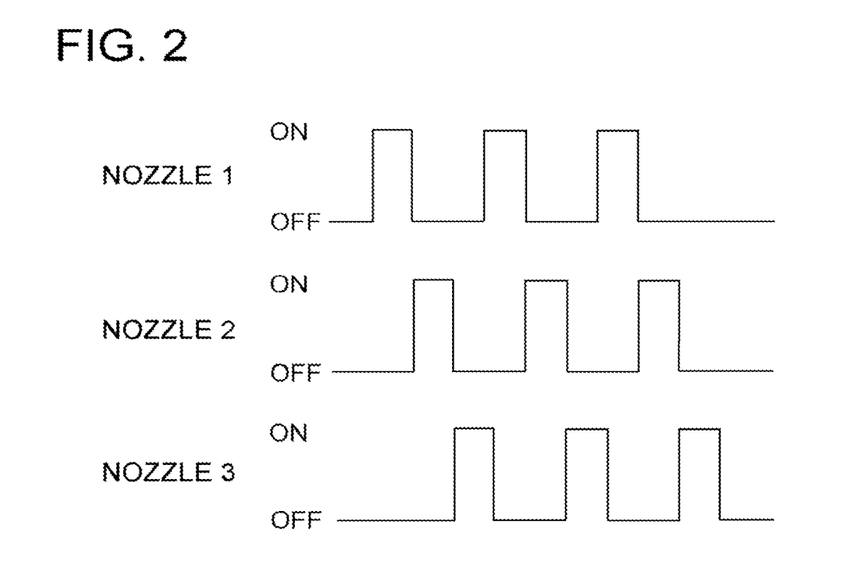
FIG. 2 is a timing chart illustrating the ejection timing of each nozzle in the first embodiment.

Here, as illustrated in FIG. 2, the nozzle 1 as the first nozzle 6a is turned ON (eject) at predetermined intervals. At the timing when the nozzle 1 is turned OFF from ON, the nozzle 2 as the second nozzle 6b is turned ON. Similarly, at the timing when the nozzle 2 is turned OFF from ON, the nozzle 3 as the third nozzle 6c is turned ON. In this manner, in the order from the center toward the periphery of the substrate W, i.e., in the order of the nozzle 1, the nozzle 2 and the nozzle 3, the treatment liquid is ejected from the nozzles 6a, 6b and 6c and supplied to the surface of the rotating substrate W. While being ON, each of the nozzles 6a, 6b and 6c intermittently ejects the treatment liquid for a preset time.

Thus, the nozzles 6a, 6b and 6c intermittently eject the treatment liquid in the order from the center toward the periphery of the substrate W to supply it to the surface of the rotating substrate W. The treatment liquid supplied from the nozzle 6a to the vicinity of the center of the substrate flows to the periphery by centrifugal force. Similarly, the treatment liquid supplied from the nozzle 6b to the vicinity of the radius center of the substrate also flows to the periphery by centrifugal force. In addition, the treatment liquid supplied from the nozzle 6c to near the periphery of the substrate also flows to the periphery by centrifugal force. As a result, the surface of the substrate W is covered by the treatment liquid during the substrate processing.

At this time, a new treatment liquid (fresh treatment liquid) is supplied to the vicinity of the radius center and the periphery of the substrate as well as the vicinity of the center. If the treatment liquid is supplied only to the vicinity of the center of the substrate, the vicinities of the radius center and the periphery of the substrate are supplied with the treatment liquid in which reaction or pollution has progressed (old treatment liquid). However, when the treatment liquid is directly supplied to the vicinity of the radius center and the periphery of the substrate in addition to the vicinity of the center of the substrate, the vicinities of the radius center and the periphery of the substrate are also supplied with new treatment liquid (fresh treatment liquid). Thus, the difference in treatment between the center and the periphery of the substrate can be suppressed from occurring. Accordingly, the uniformity of treatment (e.g., etching and cleaning etc.) to the surface of the substrate W is improved.

Figure 3:
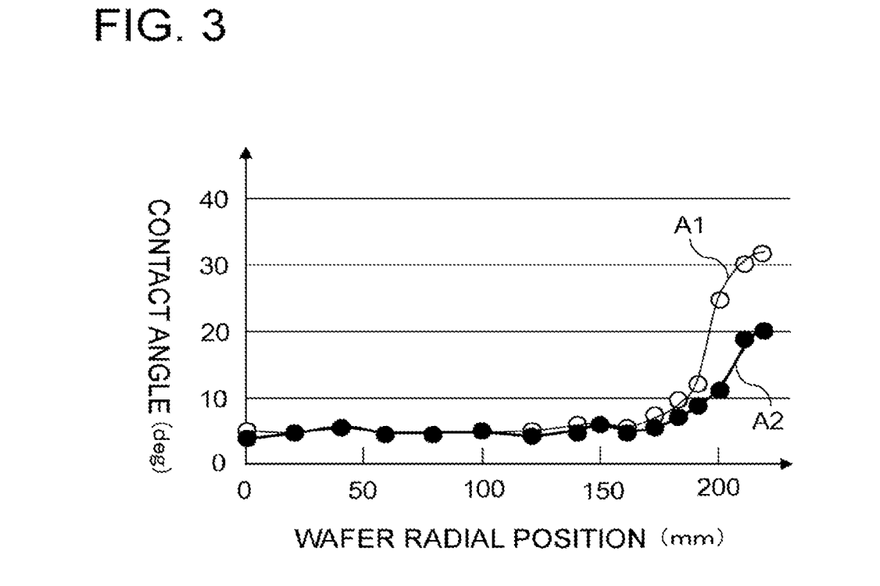
FIG. 3 is a graph illustrating the relationship between the radial position of a wafer and the contact angle in the first embodiment.

In FIG. 3, a graph A1 indicates the result of a case where the treatment liquid is supplied only from the nozzle 6a (see white circles). On the other hand, a graph A2 indicates the result of a case where the treatment liquid is intermittently supplied from the nozzles 6a, 6b and 6c in the order as described above (see black circles). In the graph A2, the contact angle (deg) is smaller than that of the graph A1 (the contact angle becomes smaller as the process progresses). In particular, around the radial position of 200 mm in a circular wafer as the substrate W, the contact angle is reduced to approximately ½ or ⅔. Incidentally, the diameter of the wafer is, for example, 450 mm.

When each of the nozzles 6a, 6b and 6c intermittently ejects the treatment liquid to be supplied to the surface of the substrate as described above, changes in the contact angle become as indicated by the graph A2 from the state of the graph A1. Thus, the difference in the contact angle (e.g., the difference between the maximum value and the minimum value) becomes small. As a result, it can be seen that treatment difference is reduced among locations on the surface of the substrate W, such as between around the center and the periphery of the surface of the substrate. By the supply of the treatment liquid as described above, the difference in treatment between the center and the periphery of the substrate can be suppressed from occurring.

The movement of the nozzles 6a, 6b and 6c by the rocking mechanism 7 is limited during the treatment. This prevents the generation of particles due to the movement of the nozzles 6a, 6b and 6c, and thereby preventing the substrate W under treatment from being contaminated by the particles.

As described above, according to the first embodiment, a treatment liquid is ejected to the surface of the rotating substrate W from each of the nozzles 6a, 6b and 6c, which are aligned from the center toward the periphery of the substrate W. Thereby, the difference in treatment between the center and the periphery of the substrate W can be suppressed from occurring. This eliminates the need to keep supplying the treatment liquid until the end of treatment for the periphery of the substrate to suppress the difference in the treatment, resulting in less processing time and reduced consumption of the treatment liquid. In this way, it is possible to realize a reduction in the processing time and the consumption of the treatment liquid.

(Second Embodiment)

A second embodiment will be described with reference to FIGS. 4 to 9.

The second embodiment is basically similar to the first embodiment. Therefore, in the second embodiment, a description is given only of differences from the first embodiment (the ejection timing of each nozzle), and the same description will not be repeated.

Figure 4:
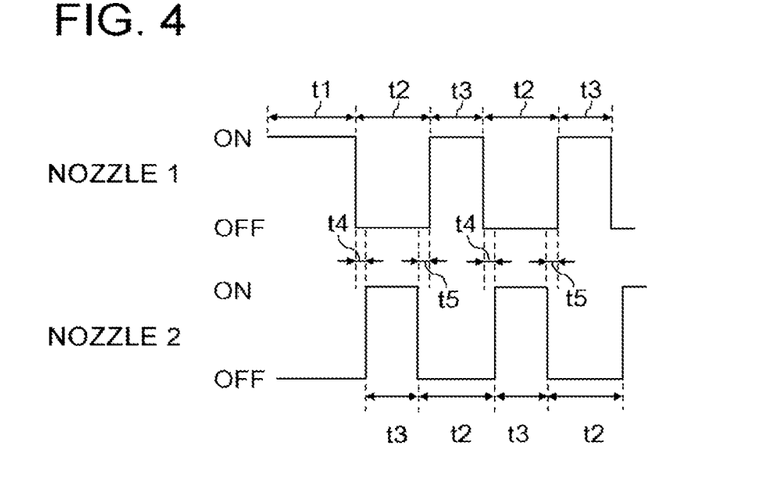
FIG. 4 is a timing chart illustrating the ejection timing of each nozzle according to a second embodiment.

As illustrated in FIG. 4, the first nozzle 6a (nozzle 1) turns ON (eject) at the timing to start supplying a liquid, and turns OFF after the lapse of time t1 from the timing to turn ON. Then, the first nozzle 6a turns ON after the lapse of time t2 from the timing to turn OFF, and turns OFF after the lapse of time t3 from the timing to turn ON. Thereafter, the first nozzle 6a repeatedly turns ON for time t3 at intervals of time t2 until the timing to end the supply of the liquid.

The second nozzle 6b (nozzle 2) turns ON after the lapse of time t4 from the timing when the first nozzle 6a turns OFF from ON, and turns OFF after the lapse of time t3 from the timing to turn ON. Thereafter, the second nozzle 6b repeatedly turns ON for time t3 at intervals of time t2. Besides, after the lapse of time t5 from the timing at which the second nozzle 6b turns OFF from ON, the first nozzle 6a turns ON from OFF. In FIG. 4, the following relationship holds: $t1 \geq t3$, $t2 = t3 + t4 + t5$, and $0 \leq t5 \leq t4$.

The relationship in ejection timing between the first nozzle 6a (inner peripheral nozzle) and the second nozzle 6b (outer peripheral nozzle) corresponds to the relationship in ejection timing between the inner peripheral nozzle and the outer peripheral nozzle. Therefore, the relationship of the ejection timing is applied to the relationship in ejection timing between the second nozzle 6b and the third nozzle 6c. That is, the second nozzle 6b represents the inner peripheral nozzle, while the third nozzle 6c represents the outer peripheral nozzle, and the same ejection timing as described above applies.

Next, a description will be given of the ejection timing of the second nozzle 6b (outer peripheral nozzle) based on the ejection timing described above in conjunction with the spread of the treatment liquid on the surface of the substrate W. As in the first embodiment, during the supply of the treatment liquid, the substrate W is being rotated in a horizontal plane. Although the ejection of the first nozzle 6a (inner peripheral nozzle) and the second nozzle 6b (outer peripheral nozzle) will be mainly described for the sake of simplicity of explanation, the same applies to the ejection of the second nozzle 6b (inner peripheral nozzle) and the third nozzle 6c (outer peripheral nozzle).

Figure 5:
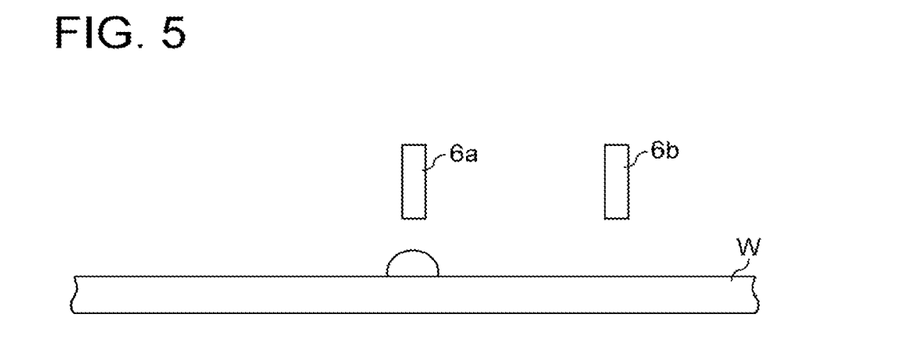
FIG. 5 is a first explanatory diagram for explaining the ejection timing of an outer peripheral nozzle in the second embodiment.
Figure 6:
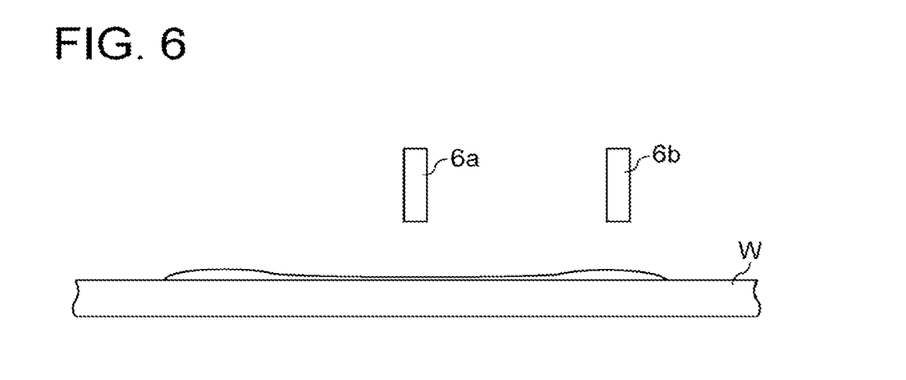
FIG. 6 is a second explanatory diagram for explaining the ejection timing of the outer peripheral nozzle in the second embodiment.

As illustrated in FIG. 5, while the first nozzle 6a (nozzle 1) is ON for time t1 (see FIG. 4), a predetermined amount of the treatment liquid is supplied from the first nozzle 6a to the surface of the substrate W. The treatment liquid supplied on the surface of the substrate W spreads toward the outer periphery of the substrate W by centrifugal force. At this time, as illustrated in FIG. 6, the treatment liquid spreads in a film on the substrate W such that the film is thicker in the outer periphery than in the inner periphery.

Figure 7:
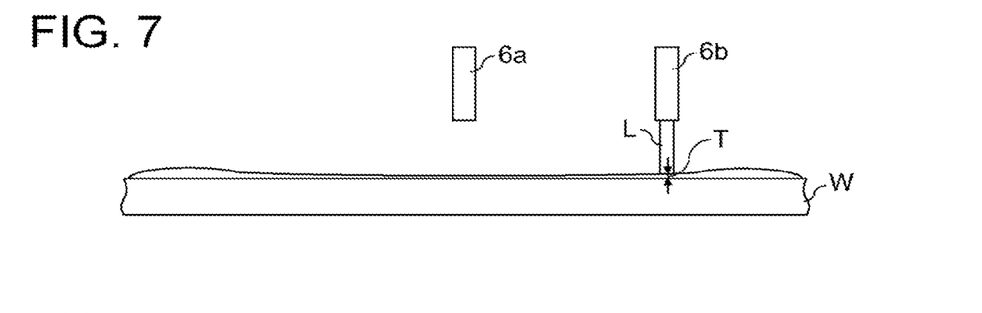
FIG. 7 is a third explanatory diagram for explaining the ejection timing of the outer peripheral nozzle in the second embodiment.
Figure 8:
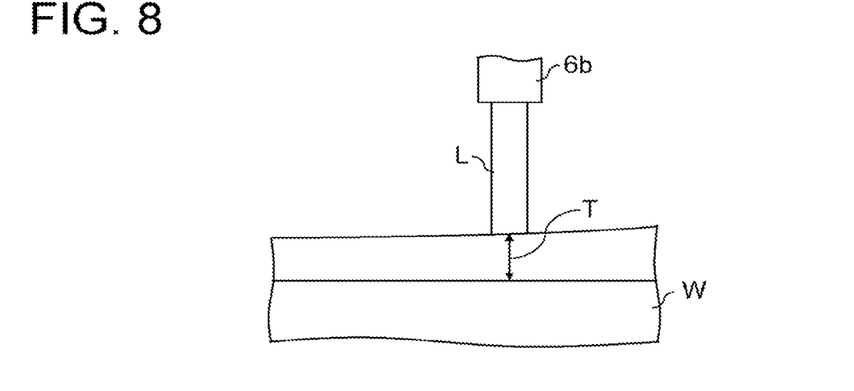
FIG. 8 is a diagram illustrating an enlarged view of the thickness of a liquid film below the outer peripheral nozzle in the second embodiment.

After the first nozzle 6a turns OFF from ON, the second nozzle 6b (nozzle 2) turns ON from OFF after the lapse of time t4 from that timing (see FIG. 4). At this time, as illustrated in FIGS. 7 and 8, the thickness of the treatment liquid below (around immediately below) the second nozzle 6b has become a predetermined thickness T or less. At this timing, the second nozzle 6b turns ON for time t3, and thereby a predetermined amount of treatment liquid L is supplied onto the surface of the substrate W from the second nozzle 6b. Incidentally, reference letter L in FIGS. 7 and 8 designates the treatment liquid supplied from the outer peripheral nozzle as the second nozzle 6b to the surface of the substrate W.

Then, after the second nozzle 6b turns OFF from ON, the first nozzle 6a turns ON from OFF after the lapse of time t5 from that timing (see FIG. 4). The first nozzle 6a turns ON for time t3, and thereby a predetermined amount of treatment liquid is supplied onto the surface of the substrate W from the first nozzle 6a.

After that, the first nozzle 6a repeatedly supplies the treatment liquid for time t3 at intervals of time t2 (see FIG. 4). Similarly, the second nozzle 6b repeatedly supplies the treatment liquid for time t3 at intervals of time t2. At this time also, as described above, at the timing when the treatment liquid below the second nozzle 6b has the predetermined thickness T or less (see FIGS. 7 and 8), a predetermined amount of the treatment liquid L is supplied onto the surface of the substrate W from the second nozzle 6b.

The controller 9 performs the ejection control based on the ejection timing as described above. Thereby, when the liquid film of the treatment liquid supplied to the surface of the substrate W from the first nozzle 6a (inner peripheral nozzle) has the predetermined thickness T or less below the second nozzle 6b (outer peripheral nozzle), the second nozzle 6b ejects the treatment liquid.

The predetermined thickness T refers to a thickness at which the amount of the treatment liquid, which has been supplied to the surface of the substrate W from the first nozzle 6a (inner peripheral nozzle) and spread toward the outer periphery by centrifugal force, retained by the treatment liquid L supplied thereto from the second nozzle 6b (outer peripheral nozzle) is the predetermined amount or less. The predetermined amount is, for example, an amount of retained treatment liquid that does not cause an adverse effect on the treatment applied to the substrate W, and is preferably 0 (zero). Examples of control factors for the liquid film thickness include the rotational speed of the substrate W, liquid flow amount, the distance between adjacent nozzles, the distance between the substrate W and the nozzles, liquid flow velocity (e.g., nozzle diameter), and the like.

Figure 9:
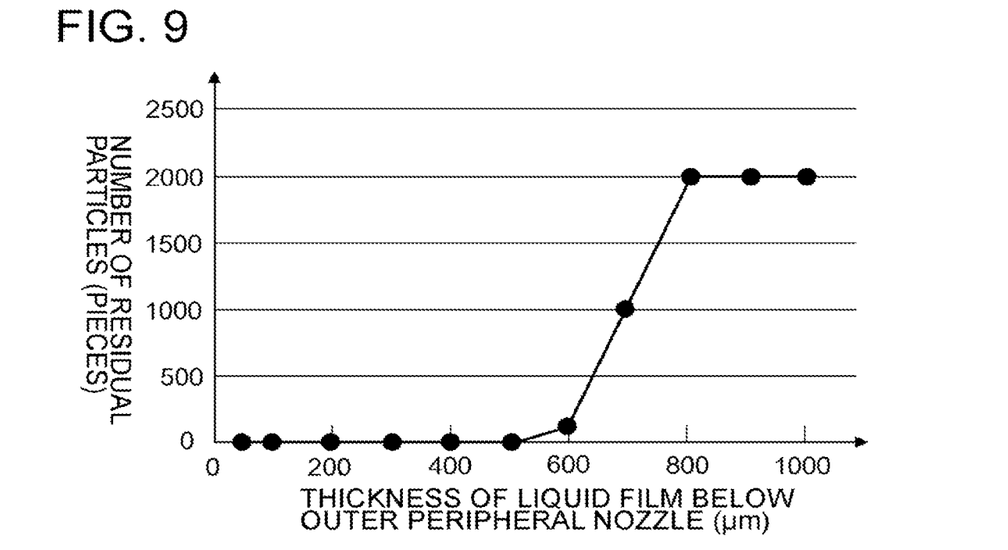
FIG. 9 is a graph illustrating the relationship between the thickness of the liquid film below the outer peripheral nozzle and the number of residual particles in the second embodiment.

For example, the predetermined thickness T is desirably 500 μm. This value is obtained based on the graph illustrated in FIG. 9. As illustrated in FIG. 9, if the thickness of the liquid film below (beneath) the outer peripheral nozzle is 500 μm or less, the number of residual particles (the number of untreated particles) is zero. On the other hand, when the thickness of the liquid film below the outer peripheral nozzle is greater than 500 μm, the number of residual particles tends to rapidly increase as follows: 100 at the thickness of 600 μm, 1000 at the thickness of 700 μm, and 2000 at the thickness of 800 μm or more. Therefore, it is desirable the predetermined thickness T be 500 μm.

If the thickness of the liquid film is 500 μm or less, the amount of the treatment liquid, which has been supplied to the surface of the substrate W from the first nozzle 6a and spread toward the outer periphery by centrifugal force, retained by the treatment liquid L supplied thereto from the second nozzle 6b is the predetermined amount or less. That is, when the film thickness of the treatment liquid spread on the surface of the substrate W toward its periphery is 500 μm or less and is thin with a small amount of liquid, even if the flow of the small amount of the treatment liquid is blocked by the treatment liquid L supplied thereto from the second nozzle 6b, the amount of retained liquid is small and equal to or less than the predetermined amount. The same relationship is found between the second nozzle 6b and the third nozzle 6c. Therefore, flows of the treatment liquid supplied from the nozzles 6a, 6b and 6c are prevented from being stacked and stagnated on the surface of the substrate W due to the interference therebetween. Thus, the number of residual particles can be reliably reduced.

On the other hand, If the thickness of the liquid film is greater than 500 μm, the amount of the treatment liquid, which has been supplied to the surface of the substrate W from the first nozzle 6a and spread toward the outer periphery by centrifugal force, retained by the treatment liquid L supplied thereto from the second nozzle 6b is more than the predetermined amount. That is, when the film thickness of the treatment liquid spread on the surface of the substrate W toward its periphery is greater than 500 μm and is thick with a large amount of liquid, if the flow of the large amount of the treatment liquid is blocked by the treatment liquid L supplied thereto from the second nozzle 6b, the amount of retained liquid is large and exceeds the predetermined amount. The same relationship is found between the second nozzle 6b and the third nozzle 6c. Therefore, flows of the treatment liquid supplied from the nozzles 6a, 6b and 6c are stacked and stagnated on the surface of the substrate W due to the interference therebetween. Accordingly, the treating capacity by the treatment liquid is reduced.

As described above, according to the second embodiment, the same effect as in the first embodiment can be achieved. That is, the nozzles 6a, 6b and 6c eject a treatment liquid at different ejection timings depending on the thickness of the liquid film of the treatment liquid on the surface of the substrate W. This suppresses the interference between flows of the treatment liquid supplied from the nozzles 6a, 6b and 6c on the surface of the substrate W. Consequently, the flows of the treatment liquid individually supplied from the nozzles 6a, 6b and 6c are prevented from being stacked and stagnated on the surface of the substrate W due to the interference therebetween. Thus, it is possible to eliminate the need to keep supplying the treatment liquid until the end of treatment for the periphery of the substrate to suppress the difference in the treatment due to the stagnation of the treatment liquid, resulting in less processing time and reduced consumption of the treatment liquid.

(Third Embodiment)

A third embodiment will be described with reference to FIGS. 10 and 11.

The third embodiment is basically similar to the second embodiment. Therefore, in the third embodiment, a description is given only of differences from the second embodiment (film thickness measuring unit and nozzle arrangement), and the same description will not be repeated.

Figure 10:
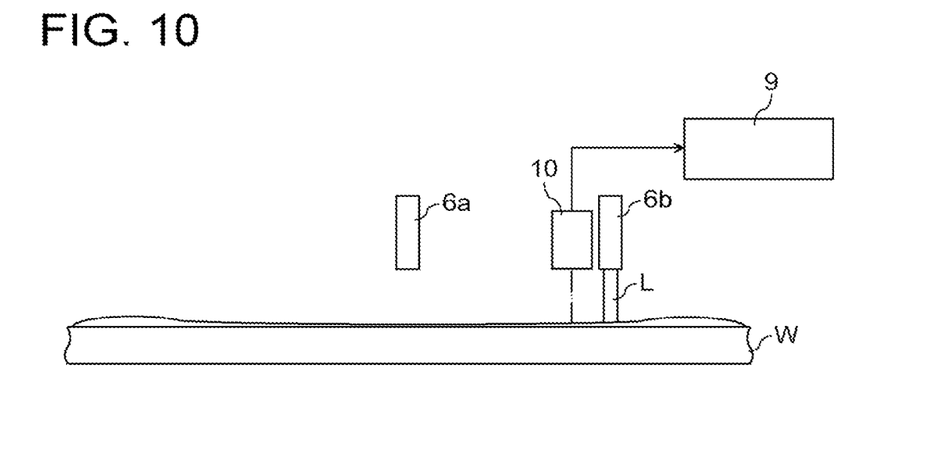
FIG. 10 is a diagram illustrating a schematic structure of a substrate processing apparatus according to a third embodiment.

As illustrated in FIG. 10, the substrate processing apparatus 1 of the third embodiment further includes a film thickness measuring unit 10 configured to measure the film thickness of the treatment liquid (the thickness of the liquid film) on the substrate W. The film thickness measuring unit 10 is arranged near the second nozzle 6b on the inner peripheral side of the substrate W, and is located between the first nozzle 6a and the second nozzle 6b. The film thickness measuring unit 10 is electrically connected to the controller 9. The film thickness measuring unit 10 measures the film thickness of the treatment liquid on the substrate W below (around immediately below) the second nozzle 6b and feeds the controller 9 with the measurement result. Reference letter L in FIG. 10 designates the treatment liquid supplied from the outer peripheral nozzle as the second nozzle 6b to the surface of the substrate W.

As the film thickness measuring unit 10, for example, a laser displacement meter or a laser interferometer may be used. The number of the film thickness measuring unit 10 is also not limited in particular. The film thickness measuring unit 10 may be arranged near the third nozzle 6c on the inner peripheral side of the substrate W to measure the ejection timing of the third nozzle 6c.

The controller 9 adjusts the timing to let the second nozzle 6b eject the treatment liquid based on the measurement result obtained by the film thickness measuring unit 10. For example, when the film thickness of the treatment liquid measured by the film thickness measuring unit 10 becomes a predetermined thickness T (e.g., 500 µm) or less after the first nozzle 6a starts the liquid supply, the controller 9 controls the second nozzle 6b to eject the treatment liquid. The ejection timing at this time is based on the film thickness actually measured, thereby enabling to improve the accuracy of the ejection timing.

Figure 11:
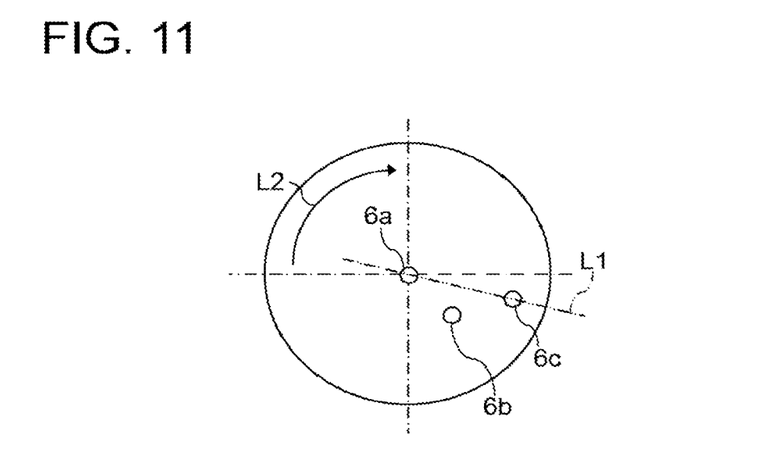
FIG. 11 is an explanatory view for explaining nozzle arrangement in the third embodiment.

As illustrated in FIG. 11, the nozzles 6a, 6b and 6c are arranged such that the ejection opening of the nozzle 6b located between the nozzle 6a on the innermost peripheral side and the nozzle 6c on the outermost peripheral side is offset from an imaginary straight line L1 passing through the ejection opening of the nozzle 6a on the inner peripheral side and the ejection opening of the nozzle 6c on the outer peripheral side not to be located on the imaginary straight line L1. Further, the nozzle 6b is offset by a predetermined distance in the rotational direction L2 from the imaginary straight line L1. This suppresses the interference between flows of the treatment liquid supplied from the nozzles 6a, 6b and 6c on the surface of the substrate W. Thus, it is possible to reliably prevent the flows of the treatment liquid from being stacked and stagnated.

As described above, according to the third embodiment, the same effect as in the second embodiment can be achieved. In addition, by measuring the film thickness of the treatment liquid on the surface of the substrate W, the ejection timing of the nozzles 6a, 6b and 6c can be varied according to the film thickness measured, and thereby the treatment liquid is ejected at different timings. This reliably suppresses the interference between flows of the treatment liquid supplied from the nozzles 6a, 6b and 6c on the surface of the substrate W. Thus, it is possible to reliably prevent the flows of the treatment liquid from being stacked and stagnated.

In addition, the nozzles 6a, 6b and 6c are arranged such that the ejection opening of the nozzle 6b located between the nozzle 6a on the innermost peripheral side and the nozzle 6c on the outermost peripheral side is offset from the imaginary straight line L1 passing through the ejection opening of the nozzle 6a on the inner peripheral side and the ejection opening of the nozzle 6c on the outer peripheral side. Thus, it is possible to further reliably suppress the interference between flows of the treatment liquid supplied from the nozzles 6a, 6b and 6c on the surface of the substrate W.

Incidentally, if the nozzle 6a is not provided and only the nozzles 6b and 6c are used, the nozzles 6b and 6c are arranged such that the ejection opening of the nozzle 6b located between the center of the substrate and the nozzle 6c on the outer peripheral side is offset from an imaginary straight line passing through the center of the substrate and the ejection opening of the nozzle 6c. Thus, it is possible to further reliably suppress the interference between flows of the treatment liquid supplied from the nozzles 6b and 6c on the surface of the substrate W.

(Other Embodiments)

In the first and second embodiments described above, the nozzles 6a, 6b and 6c eject the treatment liquid at different ejection timings, i.e., in the order from the center toward the periphery of the substrate W; however, this is not so limited. For example, the order may be changed, and the nozzles 6a, 6b and 6c may eject the treatment liquid in the reverse order from the periphery toward the center. Besides, the order may be changed during the treatment. However, to prevent the surface of the substrate W from being dried, desirably, the treatment liquid is first ejected from the nozzle 6a facing near the center of the surface of the substrate W on the support 4.

Figure 12:
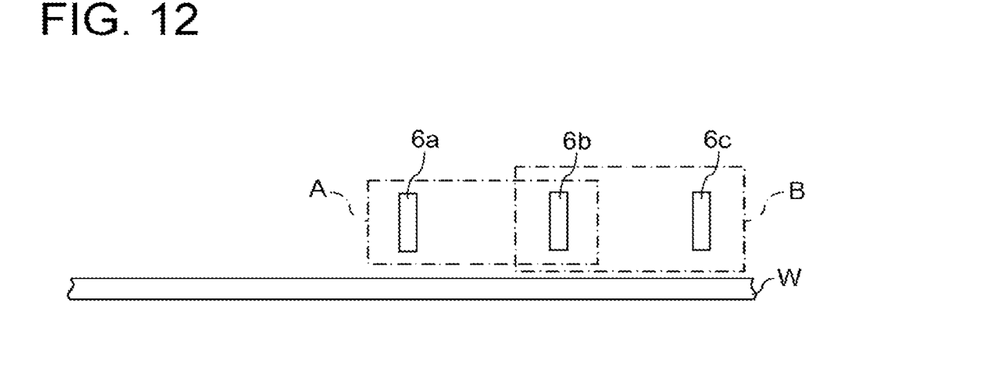
FIG. 12 is an explanatory view for explaining the ejection order of nozzles according to another embodiment.

For example, in the step of performing a hydrophilic treatment using ozone water after etching with HF ends, as illustrated in FIG. 12, the treatment liquid may be ejected intermittently and repeatedly from the inner to the outer periphery of the substrate W as follows: the nozzle 6a→the nozzle 6b→the nozzle 6c→the nozzle 6a→the nozzle 6b→the nozzle 6c . . . to hydrophilize the entire surface of the substrate W. The treatment liquid may also be ejected intermittently and repeatedly from the inner to the outer and from the outer to the inner periphery of the substrate W as follows: the nozzle 6a→the nozzle 6b→the nozzle 6c→the nozzle 6b→the nozzle 6a . . . to hydrophilize the entire surface of the substrate W. In either case, by repeating the ejection to the inner and outer peripheries in order, fresh ozone water can always be supplied thereto. Thus, the entire surface of the substrate W can be made hydrophilic. Note that the fresh ozone water refers to a liquid or water in which ozone gas dissolved therein is not evaporated.

On the other hand, for example, for etching an oxide film on the surface of the substrate W with HF, the treatment liquid may be ejected intermittently and repeatedly from the outer to the inner and from the inner to the outer periphery of the substrate W as follows: the nozzle 6c→the nozzle 6b→the nozzle 6a→the nozzle 6b→the nozzle 6c . . . to start the etching from the outer periphery of the substrate W. Alternatively, using the nozzles 6a and 6b as a group A, the treatment liquid may be ejected intermittently to near the center of the substrate W first as follows: the group A→the nozzle 6c→the group A→the nozzle 6c . . . to etch only the outer periphery of the substrate W after the etching of the center. Further, using the nozzles 6b and 6c as a group B, the treatment liquid may be ejected intermittently and repeatedly from the outer to the inner and from the inner to the outer periphery of the substrate W as follows: the group B→the nozzle 6a→the group B→the nozzle 6a . . . to start the etching from the outer periphery of the substrate W.

Note that, in the group A, the intermittent ejection is performed by both the nozzles 6a and 6b, which are repeatedly switched to each other. Also in the group B, the intermittent ejection is performed by both the nozzles 6b and 6c, which are repeatedly switched to each other. However, the ejection need not always be performed intermittently, and it may be performed continuously.

As described above, when there is an oxide film i.e., a film to be treated, on the surface of the substrate W, the order of the nozzles can be varied depending on the thickness of the film to be treated. For example, if the film to be treated is thicker in the outer periphery than in the inner periphery, the ejection is performed in the order to intensively supply the treatment liquid to the outer periphery. Meanwhile, if the film to be treated is thicker in the inner periphery than in the outer periphery, the ejection is performed in the order to intensively supply the treatment liquid to the inner periphery.

In the first and second embodiments described above, the nozzles 6a, 6b and 6c are arranged substantially perpendicular to the surface of the substrate W; however, it is not a limitation. The nozzles 6a, 6b and 6c may be arranged to be inclined to the surface of the substrate W. For example, the nozzles 6a, 6b and 6c may be inclined to the upstream side in the rotational direction of the substrate W.

In the first and second embodiments described above, the nozzles 6a, 6b and 6c eject the same treatment liquid; however, it is not a limitation. For example, the concentration of the treatment liquid to be ejected from the nozzles 6a, 6b and 6c may be varied such that it is higher in the order from the center toward the periphery of the substrate W or in the reverse order from the periphery toward the center. Further, since the peripheral speed is higher in the outer periphery of the substrate W, the temperature of the treatment liquid to be ejected from the nozzles 6a, 6b and 6c may be varied such that it is higher in the order from the center toward the periphery of the substrate W. That is, since the peripheral speed is higher in the outer periphery of the substrate W, the temperature of the substrate W is low in the outer periphery as compared to the center. For this reason, it is preferable to increase the temperature of the treatment liquid supplied to the outer periphery. If the concentration and temperature of the treatment liquid are adjusted in this manner, the difference in treatment can be further reduced. Thus, it is possible to promote a reduction in the processing time and the consumption of treatment liquid.

The concentration of the treatment liquid may be increased by, for example, retaining treatment liquids with different concentrations in different tanks, respectively, to supply the liquids individually to the nozzles 6a, 6b and 6c from their respective tanks. Further, a pipe for supplying pure water or the like may be connected to the middle of the pipes each leading to one of the nozzles 6a, 6b and 6c to mix the pure water with the treatment liquid to thereby change the concentration of the treatment liquid. Still further, to change the temperature of the treatment liquid, for example, the nozzles 6a, 6b and 6c may be connected to their respective pipes that supply the treatment liquid of different temperatures.

While certain embodiments have been described, these embodiments have been presented by way of example only, and are not intended to limit the scope of the inventions. For example, while the supply of first treatment liquid and that of second treatment liquid are described as not overlapping in time, they may be partly overlapped. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate processing apparatus comprising:
a support configured to support a substrate in a plane;
a rotation mechanism configured to rotate the support about an axis that crosses a surface of the substrate supported by the support as a rotation axis;
a plurality of nozzles, which are aligned from center toward periphery of the substrate supported by the support, configured to eject a treatment liquid to the surface of the substrate on the support being rotated by the rotation mechanism; and
a controller configured to control the nozzles to eject the treatment liquid at different ejection timings, wherein the nozzles includes a first nozzle and a second nozzle that is adjacent to the first nozzle and located to the periphery side of the substrate compared to the first nozzle,
the controller is further configured to:
control the second nozzle to start ejecting the treatment liquid after time t4 from when the first nozzle has stopped ejecting the treatment liquid, and
control the first nozzle to restart ejecting the treatment liquid after time t5 from when the second nozzle has stopped ejecting the treatment liquid,
wherein $0 \leq t5 \leq t4$.

2. The substrate processing apparatus according to claim 1, further comprising a film thickness measuring unit configured to measure a thickness of a liquid film on the surface of the substrate.

3. The substrate processing apparatus according to claim 1, wherein the nozzles eject the treatment liquid, temperature of which varies with respect to each of the nozzles.

4. The substrate processing apparatus according to claim 1, wherein the nozzles eject the treatment liquid, concentration of which is increased in order from the center toward the periphery of the substrate or from the periphery toward the center of the substrate.

5. The substrate processing apparatus according to claim 1, wherein, when the second nozzle starts ejecting the treatment liquid after time t4 from when the first nozzle has stopped ejecting the treatment liquid, film thickness of the treatment liquid below the second nozzle is 500 μm or less.

6. The substrate processing apparatus according to claim 1, wherein
three nozzles are aligned from the center toward the periphery of the substrate, and
an ejection opening of a nozzle located between a nozzle on an innermost peripheral side and a nozzle on an outermost peripheral side is offset from an imaginary straight line passing through an ejection opening of the nozzle on the innermost peripheral side and an ejection opening of the nozzle on the outermost peripheral side.

* * * * *